United States Patent [19]

Fujisawa et al.

[11] Patent Number: 4,555,636
[45] Date of Patent: Nov. 26, 1985

[54] PATTERN DETECTOR

[75] Inventors: Hakubun Fujisawa; Masaharu Nishiura; Hiromu Haruki; Yoshiyuki Uchida, all of Kanagawa, Japan

[73] Assignees: Fuji Electric Company, Ltd.; Fuji Electric Corporate Research & Development, Ltd., both of Kanagawa, Japan

[21] Appl. No.: 417,944

[22] Filed: Sep. 14, 1982

[30] Foreign Application Priority Data

Sep. 16, 1981 [JP] Japan ................................ 56-145712

[51] Int. Cl.[4] .............................................. H01J 40/14
[52] U.S. Cl. ...................................... 250/578; 357/45; 358/213
[58] Field of Search ............. 250/578, 211 R; 357/32, 357/45; 382/67, 68, 65; 358/106, 212, 213

[56] References Cited

U.S. PATENT DOCUMENTS

| 3,164,721 | 1/1965 | Astheimer | 250/211 R |
| 3,683,193 | 8/1972 | Weimer | 358/213 |
| 3,717,770 | 2/1973 | Dyck et al. | 357/32 |
| 3,833,762 | 9/1974 | Gudmunsen | 250/578 |
| 4,242,700 | 12/1980 | Weimer | 358/213 |

Primary Examiner—David C. Nelms
Assistant Examiner—James Gatto
Attorney, Agent, or Firm—Sughrue, Mion, Zinn, Macpeak and Seas

[57] ABSTRACT

A pattern detector comprises a plurality of photoelectric converter elements having thin film semiconductors disposed adjacently in a line in one plane. The converter elements are shaped that they overlap one another by a predetermined length when viewed in a direction perpendicular to a direction in which the converter elements are disposed. The photoelectric converter elements may be disposed in a plurality of parallel arrays, staggered so that the center of one element in one array is opposed to a space between neighboring elements of the other array.

8 Claims, 9 Drawing Figures

PATTERN DETECTOR

BACKGROUND OF THE INVENTION

This invention relates to an apparatus for detecting a missing portion of an opaque body or a opaque body greater than a predetermined size and which is capable of detecting a pattern in a minute region.

A detecting apparatus of this type is used, for example, for quality control of a sheet of laver by detecting holes and chinks in such a sheet. Heretofore, such a detector has been provided as a system which has an image sensor light receiver comprising a large number of photodiodes for receiving light that is emitted from a light projector to illuminate a body to be detected and to detect defects in it. Unfortunately, the image sensor portion for detecting light is small and, therefore, light is required to be converged prior to illumination on the body. Further, as light is converged, accuracy in detection is severely affected by the performance of the optics used for convergence. Thus, expensive optics and image sensors are required to detect with high accuracy a body having holes and chinks of various size, position and shape, like a sheet of laver.

SUMMARY OF INVENTION

In view of these deficiencies in the prior art, it is an object of the present invention to define a pattern detector exhibiting a high precision of detection by the use of thin film solar battery material, which can be made to have a large surface area.

Another object of this invention is to define a device of simple construction and high reliability for production operations.

These objects are attained by a pattern detector comprising a plurality of photoelectric converter elements having thin film semiconductors disposed adjacently in line and in one plane. The converter elements are shaped so that each element overlaps its neighboring element by a predetermined length when viewed in a direction perpendicular to the direction in which the converter elements are disposed.

In a second embodiment, a pattern detector includes an array of two parallel disposed lines of photoelectric converter elements, each line having a plurality of photoelectric converter elements having thin film semiconductors disposed in a line and in one plane. The two lines in this embodiment are staggered so that the center of any element of one line is opposed to one space between neighboring elements of the other line. Hence, when considering the entire array, the overlap is between the two lines and not in each line as in the case of the first embodiment.

The present invention will be hereinafter described with reference to the drawings and the description of the preferred embodiments that follow.

DESCRIPTION OF THE PREFERRED EMBODIMENTS

Figure 1:
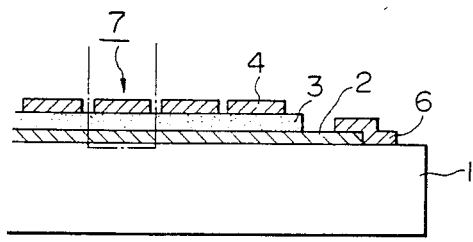
FIG. 1 is a cross sectional view illustrating one example of a pattern detector using a thin film silicon solar cell material.
Figure 2:
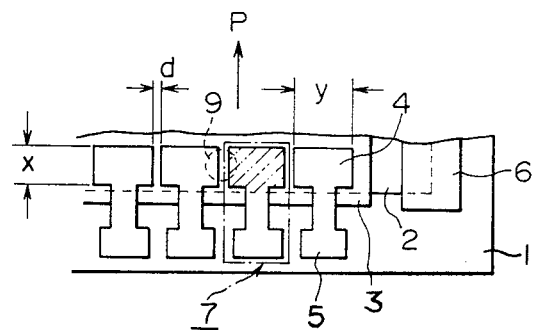
FIG. 2 is a plane view thereof.

A pattern detector according to the present invention comprises photodiodes similar to those used in a conventional image sensor but which are constructed essentially similar to the way in which a thin film solar cell is formed. FIGS. 1 and 2 show such a structure for the detector. Specifically, a transparent conductive film 2 of ITO (indium tin oxide) is deposited on a transparent substrate 1 such as glass, and then a silicon thin film 3 of amorphous silicon, which is produced by decomposing silane gas with glow discharge, is deposited on top of the film 2. The silicon thin film 3 has a photoelectric conversion active area provided by a P-N junction or surface barrier. A plurality of rectangular electrodes 4 comprising aluminium evaporated film are closely spaced and disposed adjacently in a line on the upper surface of the silicon thin film 3. Terminals 5 (FIG. 2) are connected to the electrodes 4 and a grounded electrode 6 of the transparent conductive film 2 are formed simultaneously with the electrodes 4. Each photoelectric converter element 7 is formed between each electrode 4 having the terminal 5 and the transparent conductive film 2 which acts as a common electrode.

In operation, when light strikes on the detector portion indicated by hatching with chain lines through the substrate 1, a photovoltaic force is produced and this force is transmitted to the outside through the terminal 5. If light striking on the elements 7 is locally obstructed by a body to be detected, or if light which has passed through a hole or chink in the body falls locally on one or more elements 7, then the output signal from some element will be varied. This change of output signal permits detection of a body to be detected, for example a hole or chink. However, if such a light obstructed portion or light penetrating portion passes through the middle between two neighboring elements 7 as indicated by numeral 9 in FIG. 2, then the change of output signal from either element will be equivalent to less than half of the light obstructed portion or the light penetrating portion that is the object region to be detected. Hence, the output signal will be different from that expected given the size to be detected. As a result, it will not be entirely possible to detect a region having a size which should be reasonably detected.

Figure 3:
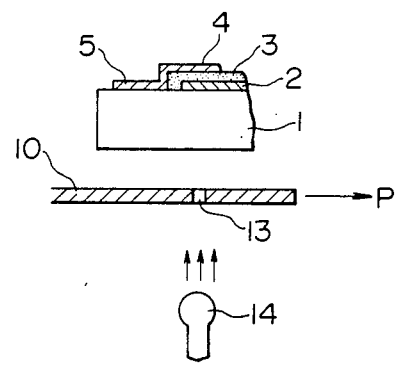
FIG. 3 is a side cross sectional view thereof.
Figure 4:
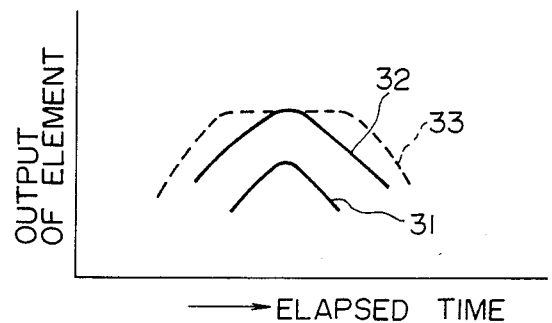
FIG. 4 is a diagram illustrating the relationships between outputs from one photoelectric converter element in which an object region to be detected is used as a parameter as a function of elapsed time when a body to be detected is moved.

As shown in FIGS. 3 and 4, if a hole 13 exists in a body 10 to be detected which is moved between the elements 7 and a light source 14 in a direction indicated by an arrow P, then light incident on a detector portion indicated by hatching with chain lines through the transparent substrate 1 and transparent conductive film 2 will cause the detector portion to produce a photovoltaic force. This is transmitted through the terminal 5 to an appropriate detector. If the hole 13 is smaller than the depth X of the detector portion, then the output signal from the element 7 as indicated by a solid line 31 in FIG. 4 will be produced. If the diameter of the hole 13 is equal to the depth X, then the output signal as indicated by a solid line 32 will be generated. Finally, if the hole 13 is greater than X, then the output signal as indicated by a broken line 33 will develop. Accordingly, the necessary sensitivity can be set by appropriately selecting the dimension of X.

On the other hand, the width Y of the detector portion perpendicular to the direction in which the body to be detected is moved does not directly affect the sensitivity. However, if Y is excessively increased, discrimination between a large number of small holes and a single large hole cannot be made and, therefore, the dimension is limited and thus the small elements 7 whose number corresponds to the width of the body 10 are arranged in a line. Hence, spaces d exist between the elements. If a projection of a very small region, such as a hole or minute body, passes through the middle between two detector portions as indicated by numeral 9, then the output signal from either element will be halved as compared to a case where the region passes through one element, and it will be different from the actual size of the object region to be detected. It is on that basis that the invention appropriately changes the electrode configuration.

Figure 5:
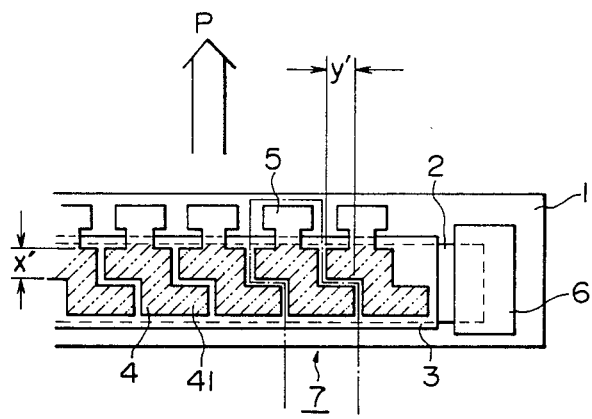
FIG. 5 is a plane view of one embodiment according to the present invention.

FIG. 5 illustrates a first example of one embodiment of the invention, in which parts used in FIGS. 1 and 2 are denoted by the same reference numerals. In this embodiment, each electrode 4 has a stagger shape, and neighboring elements 7 are located so that their extensions 41 extending in the direction in which elements 7 are disposed overlap each other when viewed in the P direction in which a body to be detected is moved. This overlap defines a "nested" orientation of the electrodes. The shape of the electrodes and arrangement thus constructed permit a projection of that region from the substrate 1 side to be totally received by the detector portion of some element 7 at each moment, if the dimension of the region to be detected is smaller than both the overlapping width Y' of neighboring elements and the width X' of each electrode in the direction in which the region is moved. Thus, the change of output signal corresponding to the size will occur at the terminal 5 of some element. That is, any region having a size greater than a predetermined size can be detected by change of output signal which is greater than a predetermined value and will occur in some element.

Figure 6:
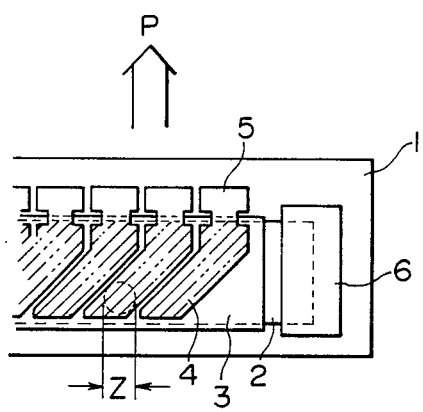
FIG. 6 is a plane view of a second example of first embodiment of this invention.

FIG. 6 illustrates a second example of the first embodiment of the present invention, in which electrodes 4 extend obliquely to the direction P in which a body to be detected is moved, and they overlap each other when viewed in the direction of movement. Therefore, any object region to be detected which is not greater than the radius z of the circle inscribed in one electrode 4 can be accurately detected.

The shapes of the electrodes 4 as shown in FIGS. 5 and 6 can be readily accomplished by the use of masks having corresponding shapes during evaporation. Such techniques are well known in the art.

Figure 7:
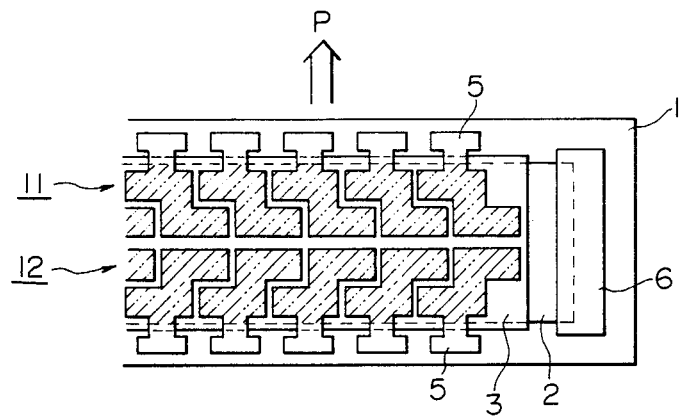
FIG. 7 is a plane view of a first example of a second embodiment of this invention.

FIG. 7 illustrates a second embodiment of the present invention, in which two rows 11 and 12 of photoelectric converter elements are disposed parallel to define the electrode array. Each row corresponds to that shown in FIG. 5 except that the lower row is reversed. With this arrangement having a plurality of rows, when one row is faulty, it can be backed up by the other. When a large number of thin film photoelectric converter elements are formed on a substrate, a single defective element may render the whole detector faulty. However, if it has backup elements, then only faultless elements can be selectively used, whereby yield in production can be substantially improved.

Figure 8:
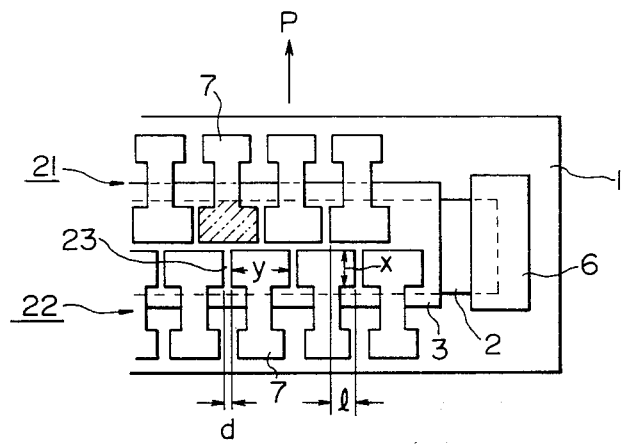
FIG. 8 is a plan illustrating a second example of the second embodiment of a pattern detector according to the present invention.

Referring to FIG. 8, a second example of the second embodiment is shown. Here, two rows 21 and 22 of photo-electric converter elements are arranged parallel, and the rows are staggered so that the center of any element 7 of one row is opposed to one space 23 between neighboring elements of the other row. This arrangement permits obtaining an output signal corresponding to the size of an object region to be detected moving in the P direction, even if a projection of the region passes through a space between neighboring elements of one row, because it passes through the center of one element of the other row. Further, in order that the region is totally projected into some element in either row at some moment when the projection passes through that element in an off-center manner, if the region is assumed to be circular, the overlapping width L between the opposite elements should be equal to or greater than the depth X of the detector portion of each element. In other words, the width Y of the detector portion in the row direction should be equal to or greater than 2X+D.

Figure 9:
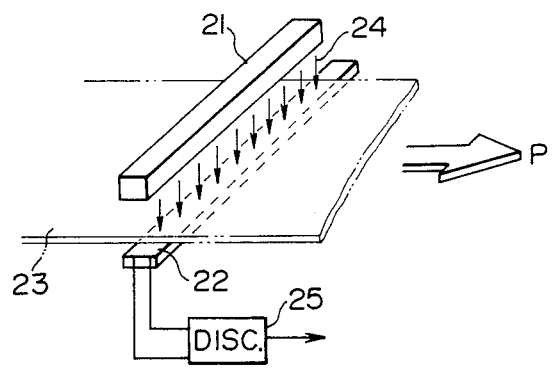
FIG. 9 is an oblique view illustrating one example of an using condition of a detector according to the present invention.

FIG. 9 illustrates a technique in which a pattern detector according to the present invention is used. Specifically, a body to be detected 10, such as a sheet of laver, is moved between a light source 14 and a detector 27 in a direction indicated by arrow P. If the body 10 has a hole or chink and light 24 from the source 14 partially passes through it, then change occurring in output signal from one or more photoelectric converter elements is discriminated by a discrimination circuit 25. This detection is used to eliminate bodies having unallowable-sized (over size) hole or a chink as substandard products.

As indicated, the present invention is characterized in that a plurality of photoelectric converter elements comprising thin film semiconductors are shaped so that they overlap each other when viewed in a movement direction while arrayed in a direction perpendicular to the movement direction. This allows for accurate detection of an obstruction or penetration of light by a minute region greater than a predetermined size. Accordingly, it can be effectively used to detect a body in a minute body as well as holes, chinks or so on in an opaque body, if they are greater than a predetermined size. Further, such a detector is obtained only by selecting shapes of electrodes on a semiconductor thin film and, therefore, it is a simple structure and is easy to manufacture. Evaporation and masking techniques may be employed. A wide detector of this type is applicable to a large body to be detected and can be also made using the same concepts. The present invention therefore offers great advantages.

It is apparent that modifications of this invention may be practiced without departing from the essential scope of this invention.

What is claimed is:

1. A pattern detector comprising a substrate; a linear array of photoelectric converter elements on said substrate, consecutive converter elements in said linear array arranged to overlap one another by a predetermined length in a direction perpendicular to the direction in which said converter elements are arrayed.

2. A pattern detector comprising; a transparent substrate, a transparent conductive film deposited on said substrate, a linear array of electrode converter elements on said conductive film and consecutive converter elements of said linear array arranged to overlap each other by a predetermined length in a direction perpendicular to the direction in which said electrode converter elements are arranged, and terminals for each of said converter elements.

3. The pattern detector of claims 1 or 2 wherein said array comprises a plurality of rows of said converter elements.

4. The pattern detector of claims 1 or 2 wherein each of said converter elements is formed in a stagger shape such that consecutive elements overlap each other in a nested orientation.

5. The pattern detector of claim 4 wherein said array comprises a plurality of rows of said converter elements and wherein the stagger shape in one row of consecutive elements is opposite to the stagger shape in a second row of consecutive elements.

6. The pattern detector of claims 1 or 2 wherein each of said converter elements extends obliquely to said direction in which said converter elements are arranged.

7. A pattern detector of claims 1 or 2 further comprising two parallel disposed rows of converter elements defining said array, each row comprising a plurality of converter elements having thin film semiconductors disposed in a line in one plane, the two rows being staggered so that the center of any element of one row is opposed to one space between neighboring elements of the other row.

8. A pattern detector set forth in claim 7 wherein the width of the converter element Y is defined by:

$$Y \geq 2X + D$$

where, X and Y are the dimensions of the detector portion of each element perpendicular and parallel, respectively, to the array direction, and D is the dimension of spaces between neighboring elements.

* * * * *